United States Patent
Ono et al.

(10) Patent No.: US 6,754,055 B2
(45) Date of Patent: Jun. 22, 2004

(54) GIANT MAGNETO-RESISTIVE EFFECT ELEMENT HAVING SMALL LEAKAGE CURRENT, MAGNETO-RESISTIVE EFFECTIVE TYPE HEAD HAVING SMALL-LEAKAGE CURRENT, THIN-FILM MAGNETIC MEMORY HAVING SMALL LEAKAGE CURRENT AND THIN-FILM MAGNETIC SENSOR HAVING SMALL LEAKAGE CURRENT

(75) Inventors: Hiroaki Ono, Miyagi (JP); Atsushi Matsuzono, Miyagi (JP); Shoji Terada, Kanagawa (JP); Shigehisa Ohkawara, Miyagi (JP); Eiji Makino, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 10/093,338

(22) Filed: Mar. 7, 2002

(65) Prior Publication Data

US 2002/0135955 A1 Sep. 26, 2002

(30) Foreign Application Priority Data

Mar. 23, 2001 (JP) .................................... P2001-085843

(51) Int. Cl.$^7$ ................................................ G11B 5/39
(52) U.S. Cl. .................. 360/324.12; 360/320; 360/322
(58) Field of Search ............................ 360/320, 324.1, 360/324.11, 324.12, 324.2, 317, 319, 322

(56) References Cited

U.S. PATENT DOCUMENTS

| | | | |
|---|---|---|---|
| 6,330,136 B1 | * | 12/2001 | Wang et al. .............. 360/324.2 |
| 6,529,353 B2 | * | 3/2003 | Shimazawa .............. 360/324.2 |
| 6,542,342 B1 | * | 4/2003 | Hayashi et al. .......... 360/324.2 |

* cited by examiner

*Primary Examiner*—Jefferson Evans
(74) *Attorney, Agent, or Firm*—Sonnenschein, Nath & Rosenthal LLP (57) ABSTRACT

A giant magneto-resistive effect element includes a laminated layer film having a ferromagnetic film, a non-magnetic film and an anti-ferromagnetic film. A current is caused to flow in the direction perpendicular to the film plane of the laminated layer film by upper and lower electrodes. Hard magnetic films are directly connected to both sides in the width direction of the laminated layer film. Insulating films are formed above or under the hard magnetic films. A current path between the upper electrodes or the lower electrodes and the laminated layer film is restricted by an opening defined between the insulating layers at both sides. The hard magnetic films have a specific resistance substantially the same as or larger than that of the laminated layer film. Further, there are provided a magneto-resistive effect type head, a thin-film magnetic memory and a thin-film magnetic sensor including the above-mentioned giant magneto-resistive effect element.

4 Claims, 8 Drawing Sheets

GIANT MAGNETO-RESISTIVE EFFECT ELEMENT HAVING SMALL LEAKAGE CURRENT, MAGNETO-RESISTIVE EFFECTIVE TYPE HEAD HAVING SMALL-LEAKAGE CURRENT, THIN-FILM MAGNETIC MEMORY HAVING SMALL LEAKAGE CURRENT AND THIN-FILM MAGNETIC SENSOR HAVING SMALL LEAKAGE CURRENT

BACKGROUND OF THE INVENTION

1. Field of the Invention

The present invention relates to a giant magneto-resistive effect element and also relates to a magneto-resistive effect type head, a thin-film magnetic memory and a thin-film magnetic sensor including this giant magneto-resistive effect element.

2. Description of the Related Art

At present, as a high-density magnetic recording device such as a hard disk drive, there is adopted a so-called merge type composite magnetic head which is provided by combining an inductive type write magnetic head and a read magnetic head utilized a magneto-resistive effect (magneto-resistive effect type head).

Figure 1:
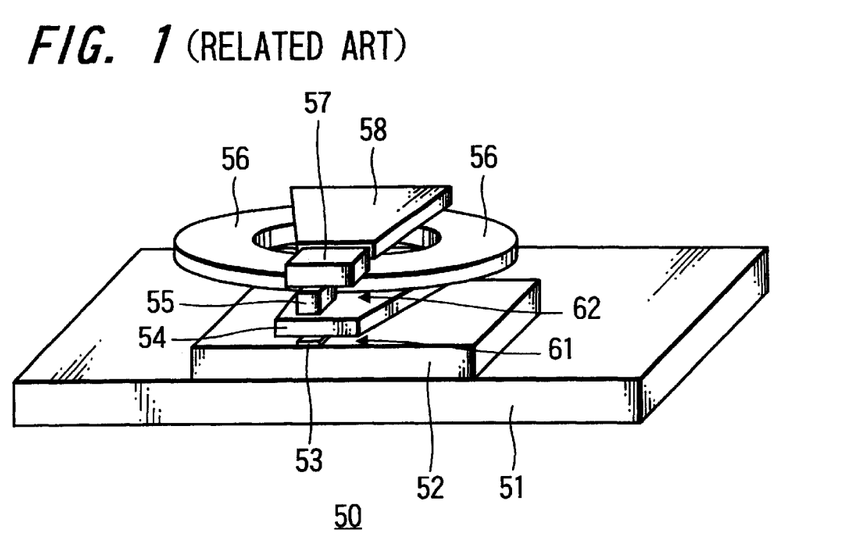
FIG. 1 is a schematic perspective view of a merge type composite magnetic head according to the related art.

FIG. 1 of the accompanying drawings is a schematic perspective view illustrating an arrangement of a merge type composite magnetic head. A gap film and an insulating film are not shown in FIG. 1.

As show in FIG. 1, a magnetic sensing element 53 is disposed on a lower shield 52 made of a magnetic material formed on a substrate 51, and an upper shield 54 made of a magnetic material is formed on an upper layer.

The lower shield 52, the magnetic sensing element 53 and the upper shield 54 constitute a read magnetic head 61 as a lower layer magnetic head. As the magnetic sensing element 53, there is used an element having a magneto-resistive effect, i.e., a magneto-resistive effect element (MR element).

The upper shield 54 serves also as a lower layer magnetic core of a recording upper magnetic head, and a tip end pole portion 55 is disposed above the upper shield 54. An upper layer magnetic core 57 is connected onto the tip end pole portion 55. Further, a back yoke 58 is connected to the rear portion of the upper layer magnetic core 57. Then, a coil 56 is disposed among the lower layer magnetic core 54, the upper layer magnetic core 57 and the back yoke 58 through an insulating layer.

The lower layer magnetic core 54, the coil 56, the tip end pole portion 55, the upper layer magnetic core 57 and the back yoke 58 constitute and inductive type write magnetic head 62 as an upper magnetic head.

Then, a merge type composite magnetic head 50 is constructed by laminating the read magnetic head 61 of the lower layer and the write magnetic head 62 of the upper layer.

As a magneto-resistive effect element (MR element) for use as a magneto-resistive effect type head comprising the read magnetic head 61 of the lower layer of this composite magnetic head 50, there is recently used a giant magneto-resistive effect element (GMR element) which can demonstrate a higher sensitivity.

The GMR element which becomes commercially available at present is used in a so-called CIP (current in plane) mode in which a sense current for detecting a magneto-resistive effect flows in the direction parallel to the film plane of the laminated layer film.

However, in the arrangement of the CIP type GMR element which is used in this CIP mode, when a recording density is further increased from now on, there will be a limit on increasing a recording density in rear future from a standpoint of electrical short-circuit between a shield film and a hard film to which the sense current flows, an electromigration and so forth.

From this background, recently, there has been examined a CPP type GMR element which may be used in a so-called CPP (current perpendicular to the plane) mode in which a sense current flows to the direction perpendicular to the film plane of the laminated layer film of the GMR element.

Since the CPP type GMR element uses a shield film as an electrode, an insulating layer between the shield layer and the GMR element can be removed, the above-mentioned problem of the electrical short-circuit can be solved fundamentally.

Moreover, since the CPP type GMR element can increase its area in which it comes in contact with an electrode film formed of a metal film having an excellent thermal conduction, this CPP type GMR element has a characteristic such that an electromigration becomes difficult to occur at a remarkably higher current density as compared with the CIP type GMR element. Therefore, it may be considered that this CPP type GMR element becomes able to realize a narrow gap and a narrow track width which are the requirements of the high density recording magnetic head.

Figure 2:
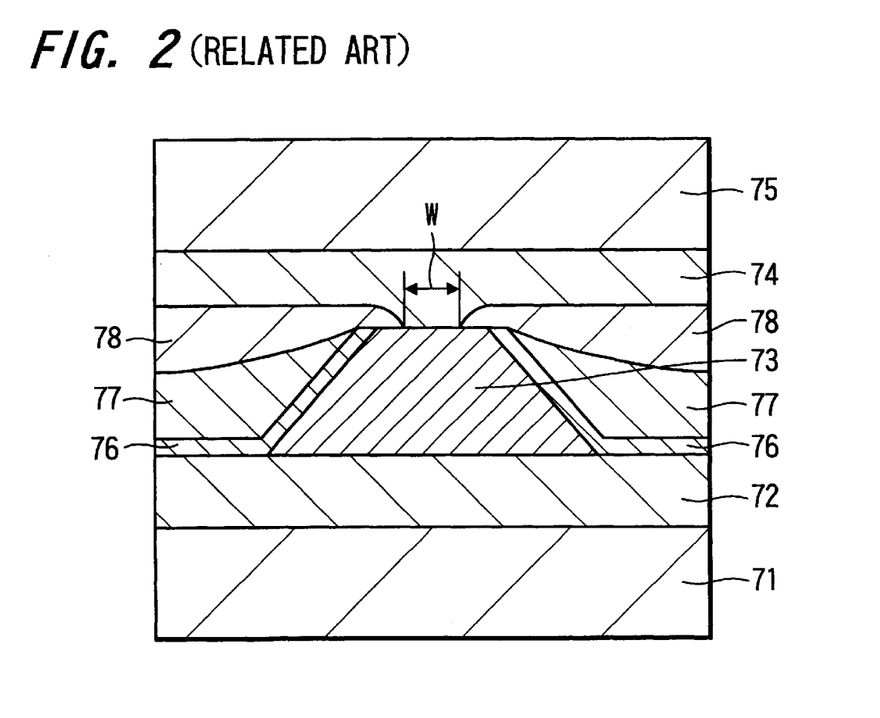
FIG. 2 is a schematic cross-sectional view showing a GMR element which can be used in the CPP mode according to the related art.

FIG. 2 is a schematic diagram (cross-sectional view) of the GMR element which can be used in this CPP mode.

In the arrangement of the CPP type GMR element shown in FIG. 2, a conductive hard magnetic material is used as a hard magnetic film (hard film) which is useful for stabilizing the GMR element.

As shown in FIG. 2, on a lower magnetic shield 71 made of a magnetic material, there is deposited a GMR element 73 whose cross-section is a trapezoid through a lower gap film 72 made of a non-magnetic conductive material and which serves also as an electrode film. Although not shown, this GMR element 73 is comprised of a laminated layer film of a magnetic film and a non-magnetic film. On the right and left of the GMR element 73, there are disposed hard magnetic films 77 made of a conductive hard magnetic material through insulating films 76 such as alumina films. The insulating films 76 are adapted to insulate the GMR element 73 and the conductive hard magnetic films 77 from each other. On the hard magnetic films 77, there are deposited insulating layers 78 over the GMR element 73. AN upper magnetic shield 75 made of a magnetic material is disposed on the insulating layers 78 through an upper gap film 74 made of a non-magnetic conductive material. The upper gap film 74 serves also as an electrode film and is connected to the GMR element 73 through an opening (width W) defined between the right and left insulating layers 78.

The lower magnetic shield 71 and the lower gap film 72 constitute a lower electrode, and the upper magnetic shield 75 and the upper gap film 74 constitute an upper electrode. Through these lower and upper electrodes, a sense current in the direction perpendicular to the film plane of the laminated layer film can flow to the GMR element 73. Moreover, the hard magnetic film 77 can stabilize the GMR element 73 magnetically.

In the arrangement shown in FIG. 2, the respective layers can function as follows:

The lower magnetic shield 71 and the upper magnetic shield 75 can function to restrict a signal magnetic field from being entered into the GMR element 73 in order to increase a recording density in the axis direction of a recording medium (not shown). As the materials of the lower magnetic shield 71 and the upper magnetic shield 75, there may be used NiFe, FeN and so forth.

The lower gap film 72 and the upper gap film 74 made of the non-magnetic conductive materials can function to magnetically separate the lower magnetic shield 71, the upper magnetic shield 75 and the GMR element 73 from each other. The GMR head which includes the CIP type GMR element needs an insulating material such as an alumina as the gap film in order to insulate the magnetic shield and the GMR element from each other. On the other hand, the GMR head which includes the CPP type GMR element uses the conductive materials as the lower and upper magnetic gap films 72 and 74 in order to enable the sense current to flow through the lower and upper magnetic gap films 72 and 74 to the GMR element 73. Au, Cu, Ta and so forth, for example, may be used as the conductive materials of the lower and upper magnetic gap films 72 and 74.

When the signal magnetic field entered into the GMR element 73 from the recording medium (not shown) is changed, an electric resistance of the GMR element 73 also is changed in response to the change of the signal magnetic field. At that very time, when the current (sense current) is flowing through the GMR element 73, it is possible to detect the change of the electric resistance as an output.

The insulating films 76 between the GMR element 73 and the hard magnetic film 77 should preferably be made as thin as possible from the standpoint of a stabilizing magnetic field applied to the GMR element 73.

If the insulating films 76 are thick, then a spacing loss occurs in the stabilizing magnetic field which is applied from the hard magnetic film 77 to the magnetization free layer of the GMR element 73 and the GMR element 73 cannot be stabilized sufficiently. As a consequence, there occur various defects such as a Barkhausen noise and a hysteresis noise.

Having considered the dispersions of the film deposited states in the process in which the insulating films 76 are deposited and the number of processes increased when the insulating films 76 are deposited, if possible, the insulating films 76 should preferably be removed.

With respect to the spacing loss caused by the insulating films between the GMR element and the hard magnetic film, let us examine this spacing loss in accordance with a simulation.

Figure 3:
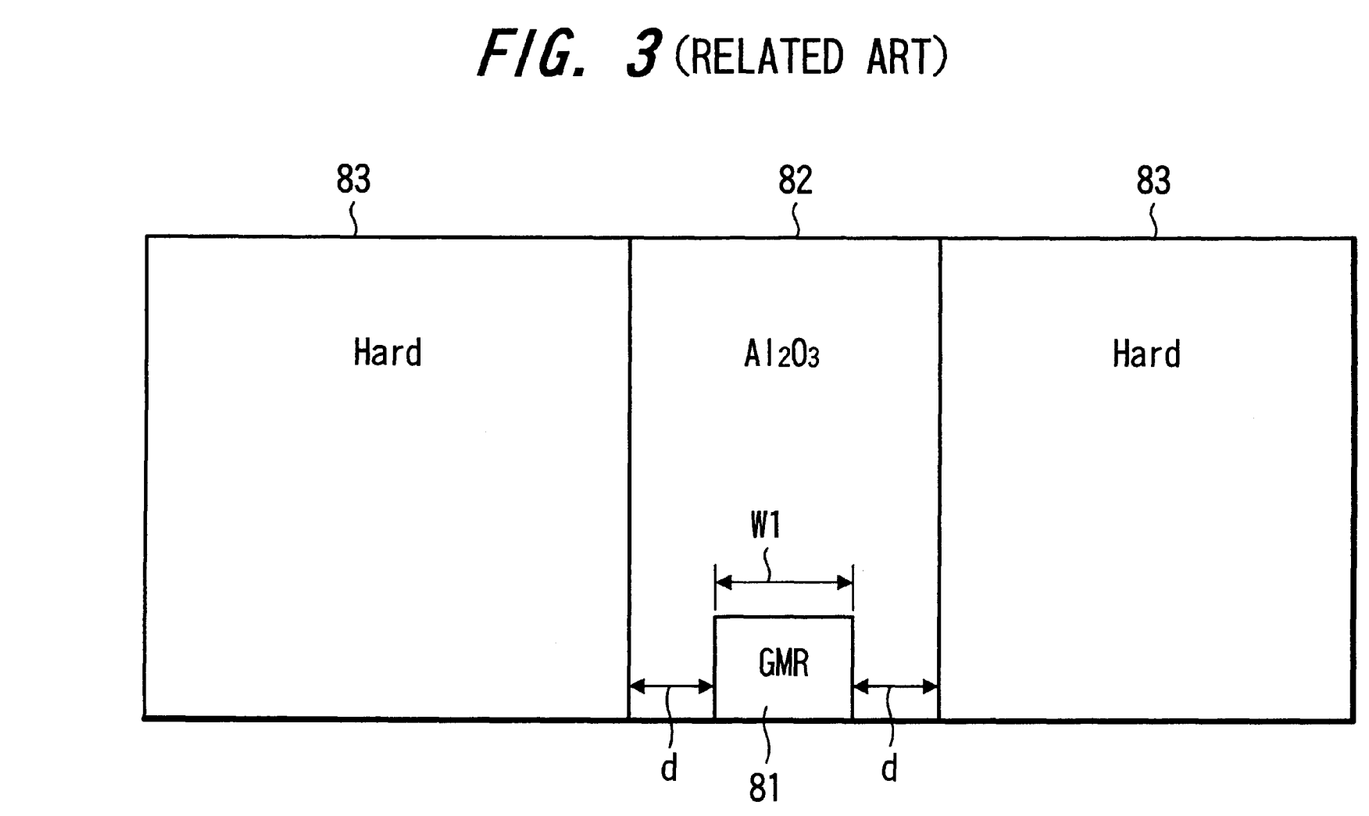
FIG. 3 is a diagram showing a model which is simulated with respect to a spacing loss caused by an insulating film disposed between a GMR element and hard magnetic films.

As shown in FIG. 3, there was employed a simulation model in which hard magnetic films (hard films) 83 are disposed on the right and left of a GMR element 81 having a width W1 of 100 namometers through an insulating film 82 made of $Al_2O_3$. There, while spacing amount d provided by the insulating film 82 were being changed, we had calculated distributions of magnetic fields within the GMR element 81 for the spacing amounts d.

Figure 4:
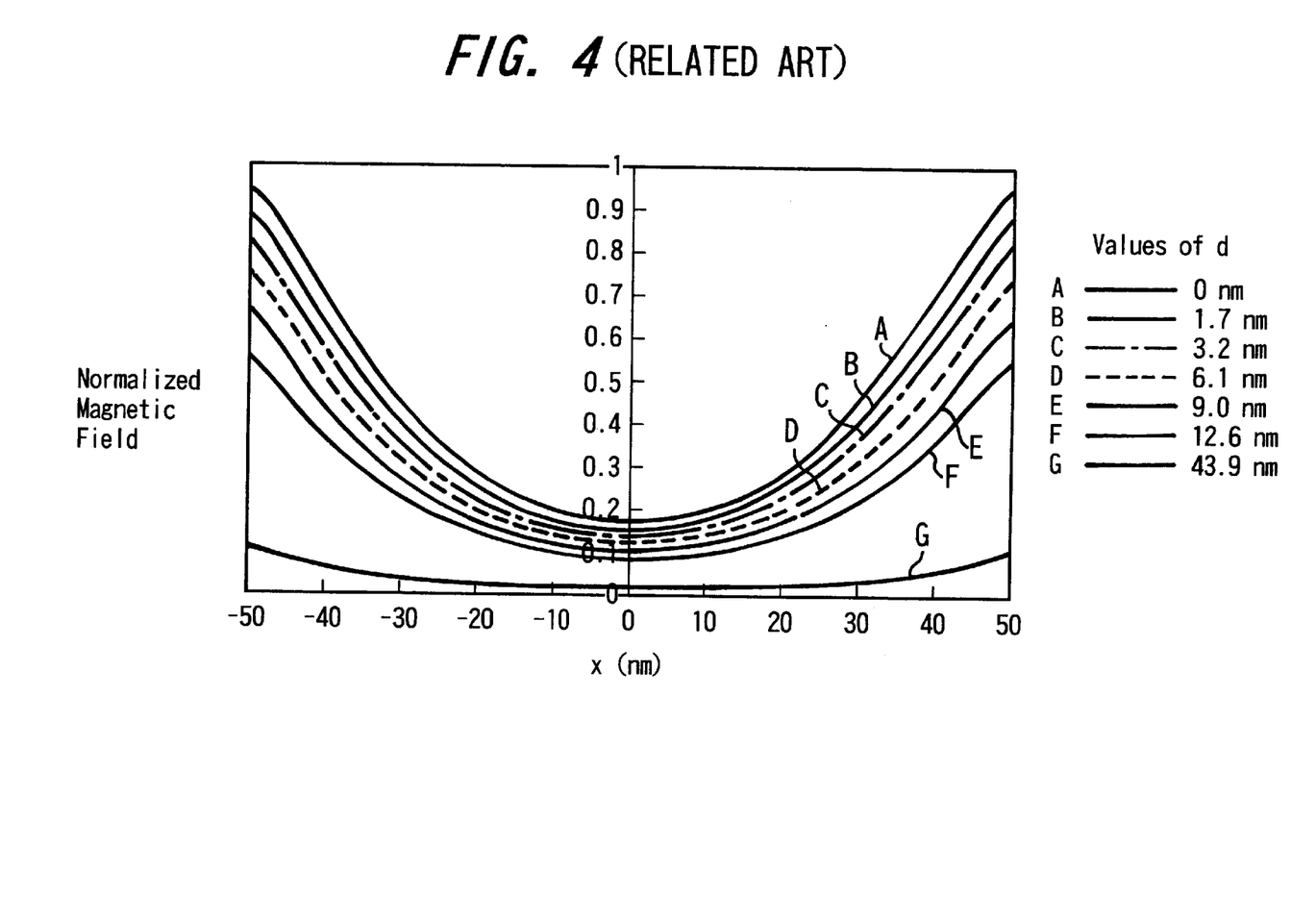
FIG. 4 is a graph showing calculated results of the changes of magnetic field distributions within the GMR element obtained when the spacing amounts in the model of FIG. 3 are changed.

FIG. 4 shows results obtained from such calculations. The longitudinal axis of FIG. 4 represents a strength of a magnetic field normalized under the state in which strengths of magnetic fields obtained at respective ends (position at which an equality of x=50 nm is satisfied) of the GMR element 81 by the hard magnetic films 83 are assumed to be an ideal value 1 obtained when the hard magnetic films 83 are brought in direct contact with the GMR element 81 without the insulating films. In FIG. 4, due to the influences exerted by the calculation method, the value obtained at the position in which the equality of x=50 nm is satisfied when d=0 is not equal to the ideal value 1.

Figure 5:
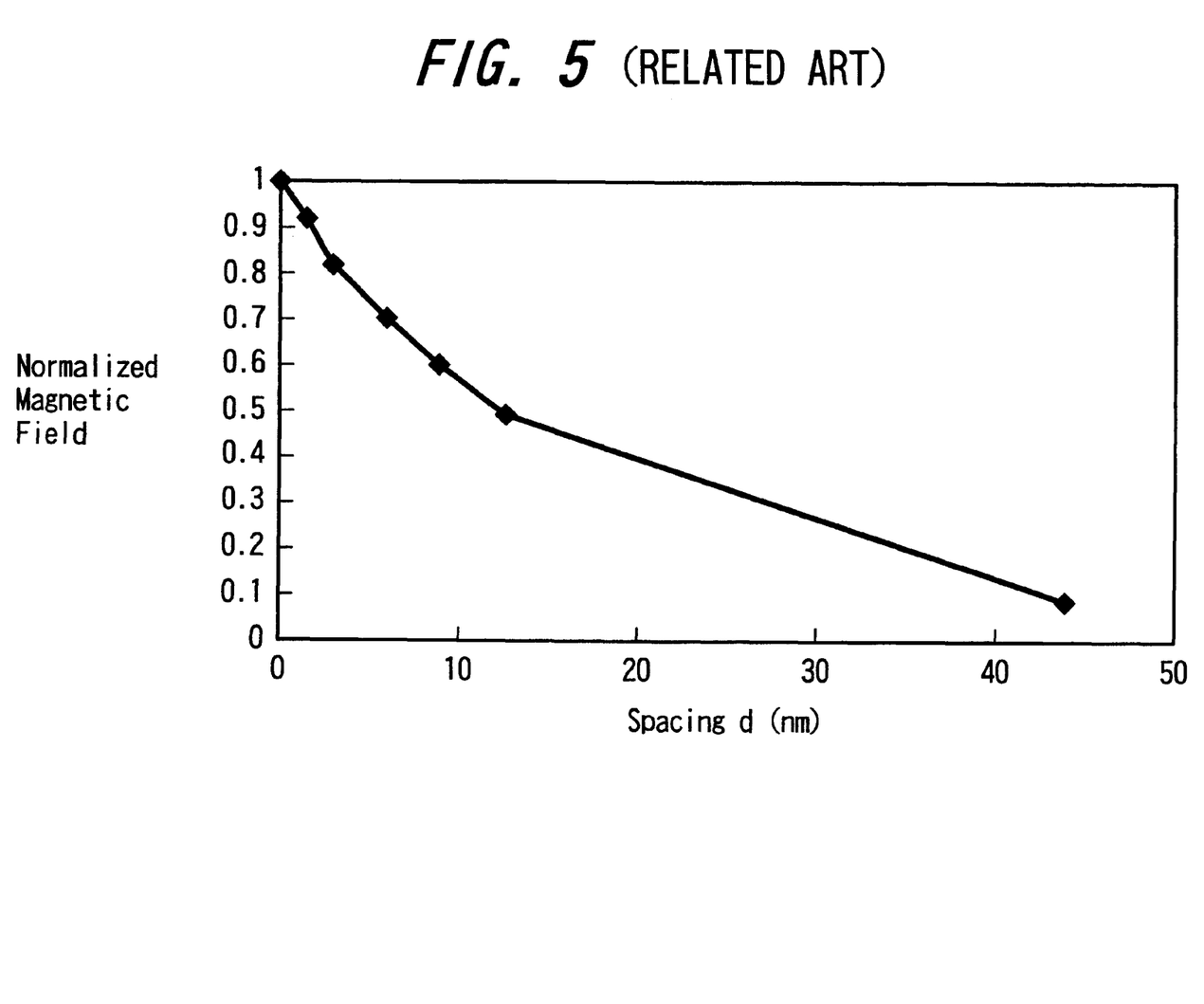
FIG. 5 is a graph showing calculated results of the changes of the strengths of the magnetic fields obtained at the central portion of the GMR element when the spacing amounts in the model of FIG. 3 are changed.

FIG. 5 shows the manner in which the strengths of the magnetic fields normalized at the central portion of the GMR element 81 are changed. The longitudinal axis of FIG. 5 shows the strengths of the magnetic fields normalized in the state where the strength of the magnetic field (about 0.17 in FIG. 4) obtained at the central portion of the GMR element 81, i.e., at the position in which an equality of x=0 is satisfied with the spacing amount d=0 is satisfied is assumed to be 1.

A study of FIGS. 4 and 5 reveals that the stabilizing magnetic field within the GMR element 81 can be reduced as the spacing amounts d, provided by the insulating film 82, increase.

SUMMARY OF THE INVENTION

In view of the aforesaid aspect, it is an object of the present invention to provide a giant magneto-resistive effect element and a highly-reliable magneto-resistive effect type head, a highly-reliable thin-film magnetic memory and a highly-reliable thin-film magnetic sensor including this giant magneto-resistive effect element in with a giant magneto-resistive effect element can sufficiently be stabilized magnetically.

It is another object of the present invention to provide a giant magneto-resistive effect element and a highly-reliable magneto-resistive effect type head, a highly-reliable thin-film magnetic memory and a highly-reliable thin-film magnetic sensor including this giant magneto-resistive effect element in which a manufacturing process can be simplified by reducing the number of processes.

It is a further object of the present invention to provide a giant magneto-resistive effect element and a magneto-resistive effect type head, a thin-film magnetic memory and a thin-film magnetic sensor including this giant magneto-resistive effect element which can be made highly reliable by suppressing dispersions in the manufacturing process and an electromigration.

According to an aspect of the present invention, there is provided a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes. This giant magneto-resistive effect element is comprised of hard magnetic films directly connected to both sides in the width direction of the laminated layer film, insulating layers formed above or under the hard magnetic films and an opening defined between the insulating films of both sides to restrict a current path between the upper electrodes or the lower electrodes and the laminated layer film, wherein the hard magnetic films have a specific resistance which is substantially the same as or larger than that of the laminate layer film.

According to another aspect of the present invention, there is provided a magneto-resistive effect type head including a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes, the giant magneto-resistive effect element, hard magnetic films directly connected to both sides in the width direction of the laminated layer film, insulating layers formed above or under the hard magnetic films and an opening defined between the insulating films of both sides to restrict a current path between the upper electrodes or the lower electrodes and the laminated layer film. This magneto-resistive effect type head is comprised of magnetic shields disposed so as to vertically sandwich the giant magneto-resistive effect element through a gap film made of a non-magnetic conductive material, wherein the gap film and the magnetic shields constitute the upper electrodes and the lower electrodes and the gap film serving also as the upper electrodes or the lower electrodes and the laminated layer film are electrically connected to each other through the opening defined between the insulating layers of both sides.

In accordance with a further aspect of the present invention, there is provided a thin-film magnetic memory which is comprised of a bit line, a word line and a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes, hard magnetic films having a specific resistance substantially the same as or larger than that of the laminated layer film are disposed at both sides in the width direction of the laminated layer film, insulating layers are formed above or under the hard magnetic films, and a current path between the upper electrodes or the lower electrodes and the laminated layer film is restricted by an opening defined between the insulating layers of both sides, wherein a memory cell having the giant magneto-resistive effect element is disposed corresponding to an intersection between the bit line and the word line.

In accordance with yet a further aspect of the present invention, there is provided a thin-film magnetic sensor which is comprised of a giant magneto-resistive effect element which comprises a laminated layer film including a ferromagnetic film, a non-magnetic film and an anti-ferromagnetic film and in which a current is caused to flow in the direction perpendicular to the film plane of the laminated layer film by upper electrodes and lower electrodes, hard magnetic films having a specific resistance substantially the same as or larger than that of the laminated layer film are disposed at both sides in the width direction of the laminated layer film, insulating layers are formed above or under the hard magnetic films, and a current path between the upper electrodes or the lower electrodes and the laminated layer film is restricted by an opening defined between the insulating layers of both sides and magnetic shields disposed so as to vertically sandwich the giant magneto-resistive effect element through a gap film made of a non-magnetic conductive material, wherein the gap film and the magnetic shields constitute the upper electrodes and the lower electrodes and the gap film serving also as the upper electrodes or the lower electrodes and the laminated layer film are electrically connected to each other through an opening defined between the insulating layers of both sides.

According to the above-mentioned arrangement of the giant magneto-resistive effect element of the present invention, since the insulating layers are formed above or under the hard magnetic films and the current path between the upper electrodes or the lower electrodes and the laminated layer film is restricted by the opening defied between the insulating layers of both sides, the current which flows through the laminated layer film (giant magneto-resistive effect element) can be deviated to flow to the central portion.

In addition, since the hard magnetic films have the specific resistance which is substantially the same as or large than that of the laminated layer film, the current can selectively flow through the laminated layer film so that the current can be suppressed from being leaked into the hard magnetic films.

Since the hard magnetic films are directly connected to the laminated layer film, the stabilizing magnetic field from the hard magnetic films acts on the giant magneto-resistive effect element strongly so that operations of the giant magneto-resistive effect element, i.e., the change of the resistance can be stabilized.

According to the above-mentioned arrangement of the magneto-resistive effect type head of the present invention, since this magneto-resistive effect type head includes the above giant magneto-resistive effect element of the present invention, the stabilizing magnetic field from the hard magnetic films acts on the giant magneto-resistive effect element strongly and the change of the resistance of the giant magneto-resistive effect element is stabilized. Therefore, there can be obtained the stable signal output in response to the signal magnetic filed from the recording medium.

Further, according to the above-mentioned arrangement of the thin-film magnetic memory of the present invention, since this thin-film magnetic memory includes the above giant magneto-resistive effect element of the present invention, the stabilizing magnetic field from the hard magnetic films acts on the giant magneto-resistive effect element strongly and the change of the resistance of the giant magneto-resistive effect element in the memory cell is stabilized. Therefore, information can be written in the giant magneto-resistive effect element of the memory cell stably and recorded information can be read out from the giant magneto-resistive effect element of the memory call stably.

Furthermore, according to the above-mentioned arrangement of the thin-film magnetic sensor of the present invention, since this thin-film magnetic sensor includes the above giant magneto-resistive effect element of the present invention, the stabilizing magnetic field from the hard magnetic films acts on the giant magneto-resistive effect element strongly and the change of the resistive of the giant magneto-resistive effect element is stabilized. Therefore, there can be obtained the stable signal output in response to the external magnetic field.

BRIEF DESCRIPTION OF THE DRAWINGS

FIGS. 10A and 10B are diagrams showing a thin-film magnetic memory according to an embodiment of the present invention to which a giant magneto-resistive effect element according to the present invention can be applied, wherein

DESCRIPTION OF THE PREFERRED EMBODIMENT

Prior to describing the preferred embodiment of the present invention in detail, let us summarize the present invention as follows:

The present invention relates to a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes. This giant magneto-resistance effect element is comprised of hard magnetic films directly connected to both sides in the width direction of the laminated layer film, insulating layers formed above or under the hard magnetic films and an opening defined between the insulating films of both sides to restrict a current path between the upper electrodes or the lower electrodes and the laminated layer film, wherein the hard magnetic films have a specific resistance which is substantially the same as or larger than that of the laminate layer film.

The present invention relates to a magneto-resistive effect type head including a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes, the giant magneto-resistive effect element, hard magnetic films having a specific resistance which is substantially the same as or larger than that of the laminate layer film disposed at both sides in the width direction of the laminated layer film, insulating layers formed above or under the hard magnetic films and an opening defined between the insulating films of both sides to restrict a current path between the upper electrodes or the lower electrodes and the laminated layer film. This magneto-resistive effect type head is comprised of magnetic shields disposed so as to vertically sandwich the giant magneto-restive effect element through a gap film made of a non-magnetic conductive material, wherein the gap film and the magnetic shields constitute the upper electrodes and the lower electrodes and the gap films drawing also as the upper electrodes or the lower electrodes and the laminated layer film are electrically connected to each other through the opening defined between the insulating layers of both sides.

Further, the present invention relates to a thin-film magnetic memory which is comprised of a bit line, a word line and a giant magneto-resistive effect element comprising a laminated layer film including a ferromagnetic film, a non-magnetic film and an anti-ferromagnetic film and in which a current is caused to flow in the direction perpendicular to the film plane of the laminated layer film by upper electrodes and lower electrodes, hard magnetic films having a specific resistance substantially the same as or larger than that of the laminated layer film are disposed at both sides in the width direction of the laminated layer film, insulating layers are formed above or under the hard magnetic films, and a current path between the upper electrodes or the lower electrodes and the laminated layer film is restricted by an opening defined between the insulating layers of both sides, wherein a memory cell having the giant magneto-resistive effect element is disposed in response to an intersection between the bit line and the word line.

Furthermore, the present invention relates to a thin-film magnetic sensor which is comprised of a giant magneto-resistive effect element which comprises a laminated layer film including a ferromagnetic film, a non-magnetic film and an anti-ferromagnetic film and in which a current is caused to flow in the direction perpendicular to the film plane of the laminated layer film by upper electrodes and lower electrodes, hard magnetic films having a specific resistance substantially the same as or larger than that of the laminated layer film are disposed at both sides in the width direction of the laminated layer film, insulating layers are formed above or under the hard magnetic films, a current path between the upper electrodes or the lower electrodes and the laminated layer film is restricted by an opening defined between the insulating layers of both sides, and magnetic shields are disposed so as to vertically sandwich the giant magneto-resistive effect element through a gap film made of a non-magnetic conductive material, wherein the gap film and the magnetic shields constitute the upper electrodes and the lower electrodes and the gap film serving also as the upper electrodes or the lower electrodes and the laminated layer film are electrically connected to each other through an opening defined between the insulating layers of both sides.

The present invention will now be described.

As mentioned before, the insulating films 76 between the GMR element 73 and the hard magnetic films 77 should preferably be removed, if possible.

Accordingly, we have examined what extent a current is leaked to the hard magnetic films when the insulating films 76 are removed and the hard magnetic films are directly connected to the GMR element.

Figure 6:
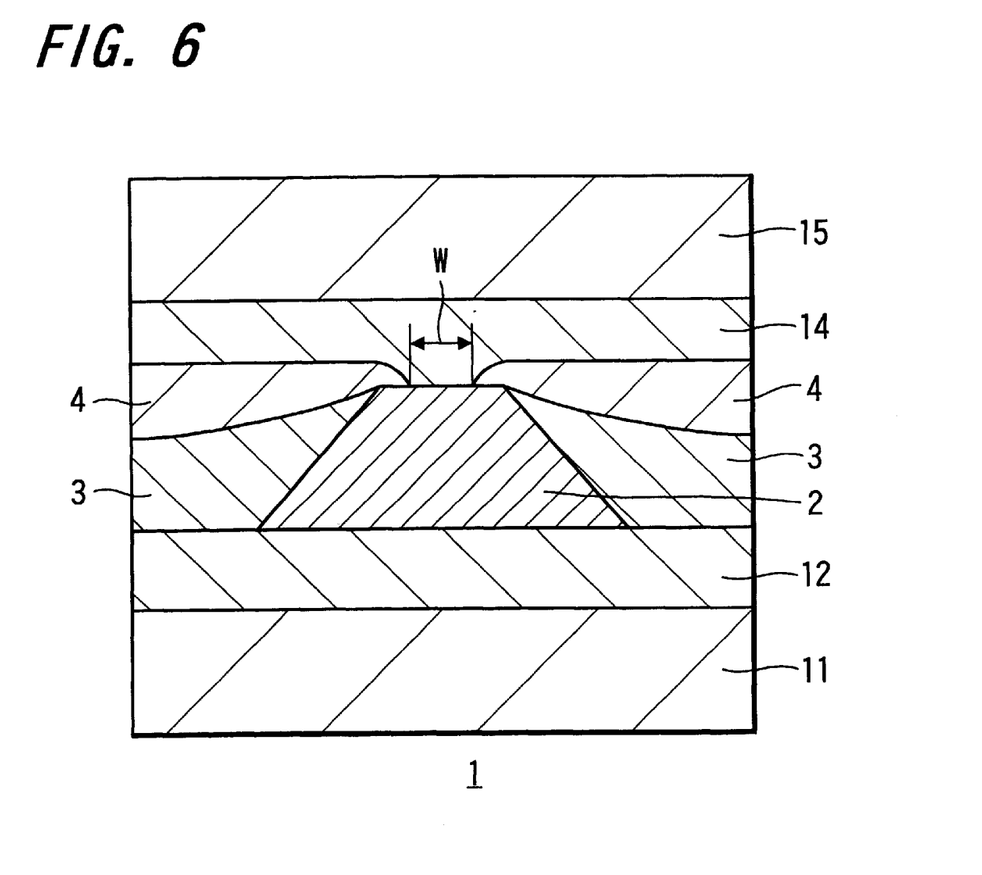
FIG. 6 is a cross-sectional view of a CPP type GMR element in which hard magnetic films are directly connected to a GMR element.

First, FIG. 6 is a schematic cross-sectional view of a CPP type GMR element which has been used to examine the above-mentioned leakage of a current.

In the cross-sectional structure shown in FIG. 6, a hard magnetic film which is used to stabilize the GMR element is made of a conductive hard magnetic material. In the cross-sectional structure shown in FIG. 6, magnetic shields are formed above and under the GMR element similarly to the case in which the CPP type GMR element is applied to a magneto-resistive effect type head and a thin-film magnetic sensor.

As shown in FIG. 6, on a lower magnetic shield 11 made of a magnetic material, there is formed a GMR element 2 through a lower gap layer 12 made of a non-magnetic conductive material and which serves also as an electrode film.

Although not shown, this GMR element 2 is comprised of a laminated layer film including a ferromagnetic film, a non-magnetic film and an anti-ferromagnetic film and the cross-section of which is trapezoidal.

On the right and left of the GMR element 2, there are disposed hard magnetic films (hard films) 3 made of conductive hard magnetic materials in such a manner that the hard magnetic films 3 may directly be connected to the GMR element 2.

On the hard magnetic films 3, there are formed insulating layers 4 across the GMR element 2. On the insulating layers 4, there are disposed an upper magnetic shield 15 made of a magnetic material through an upper gap film 14 made of a non-magnetic conductive material. The upper gap film 14 serves also as an electrode film and connected to the GMR element 2 through an opening (width W) defined between the right and left insulating layers 4.

The lower magnetic shield 11 and the upper magnetic shield 15 can function to limit a magnetic field from being entered into the GMR element 2. As the materials of the lower magnetic shield 11 and the upper magnetic shield 15, there may be used NiFe, FeN and so forth.

The lower gap film 12 and the upper gap film 14, each of which is made of a non-magnetic conductive material, can magnetically out the lower magnetic shield 11, the upper magnetic shield 15 and the GMR element 2. As the materials of the lower gap film 12 and the upper gap film 14, there may be used Au, Cu, Ta and so forth, for example.

Then, the lower magnetic shield 11 and the lower magnetic gap film 12 constitute a lower electrode, and the upper magnetic shield 15 and the upper gap film 14 constitute an upper electrode. Accordingly, a sense current which flows in the direction perpendicular to the film plane of the laminated layer film can flow to the GMR element 2 through these lower and upper electrodes, thereby resulting in the CPP type GMR element 1 being constructed.

When a magnetic field in the GMR element 2 is changed, an electric resistance of the GMR element 2 also is changed in response to the change of the magnetic field. At that very time, when the sense current is flowing through the GMR element 2, it is possible to detect the change of the electric resistance as an output.

Moreover, the GMR element 2 can magnetically be stabilized by the hard magnetic films 3.

Then, since the insulating layer 4 formed on the hard magnetic films 3 are overlapping over the GMR element 2, the width W of the connecting portion electrically connected to the GMR element 2 and the upper electrode comprised of the upper magnetic shield 15 and the upper gap film 14 may be determined by an interval between the insulating layers 4 formed at respective sides of this connection portion.

In the GMR element 2 having the arrangement shown in FIG. 6, we have examined a current efficiency within the GMR element 2 while changing a specific resistance p of the hard magnetic films 3. This current efficiency is defied as:

current efficiency=(current flowing through the GMR element)/(current flowing through the GMR element and current flowing through the hard magnetic films)

in a certain plane of a magnetization free layer which may directly contribute to the output within the GMR element 2.

Figure 7:
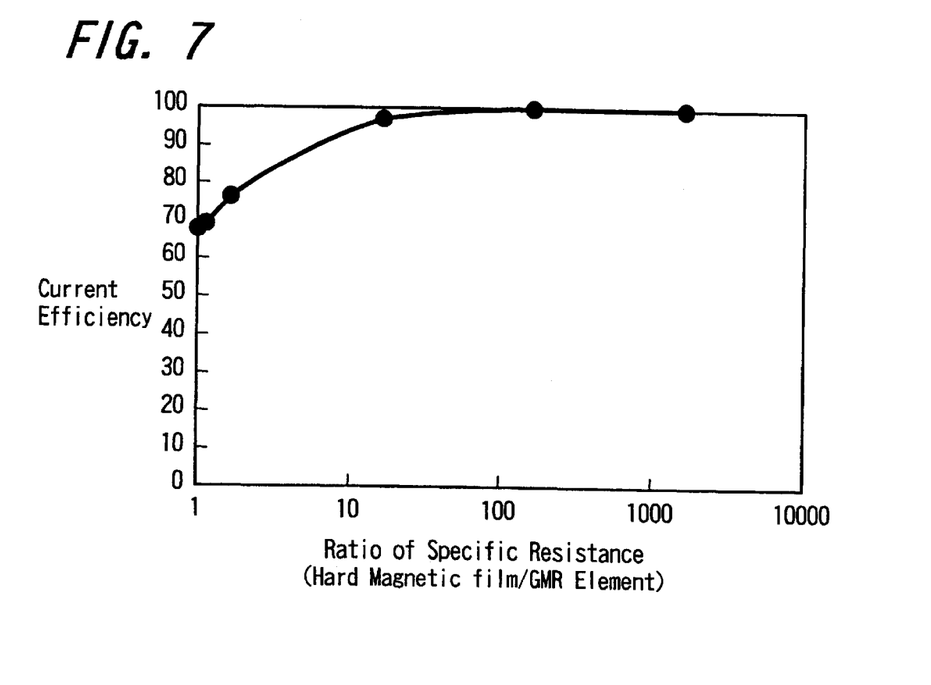
FIG. 7 is a graph showing the manner in which a current efficiency is charged within the GMR element when a specific resistance of a hard magnetic film in the GMR element shown in FIG. 6 is changed.

FIG. 7 shows the manner in which the current efficiency is changed when the specific resistance p of the hard magnetic films 3 is changed. The horizontal axis in FIG. 7 represents ration of specific resistance (specific resistance of the hard magnetic films 3/specific resistance of the GMR element 2) between the hard magnetic films 3 and the GMR element 2. The specific resistance of the above-described GMR element 2 corresponds to a composite specific resistance of the whole specific resistances of the laminated layer films of the GMR element 2. This relationship applies for the following descriptions as well.

A study of FIG. 7 reveals that a sufficiently high current efficiency of approximately 70% can be obtained if the specific resistance p of the hard magnetic films 3 is substantially the same as or large than the specific resistance of at least the GMR element 2

From these examined results, it is to be understood that, when the hard magnetic films 3 are made of the hard magnetic material having the specific resistance which is substantially the same as or large than that of the GMR element 2, even though the insulating films between the GMR element and the hard magnetic films are removed, a serious problem does not arise from a leakage current standpoint. In other words, the hard magnetic films 3 are made closer to the GMR element 2 so that the GMR element 2 can be stabilized effectively. Moreover, it may be considered that a large merit can be obtained from the standpoint in which the manufacturing process of the giant magnetoresistive effect element can be simplified.

Next, let us study the cause in which the results shown in FIG. 7 are obtained.

Figure 8:
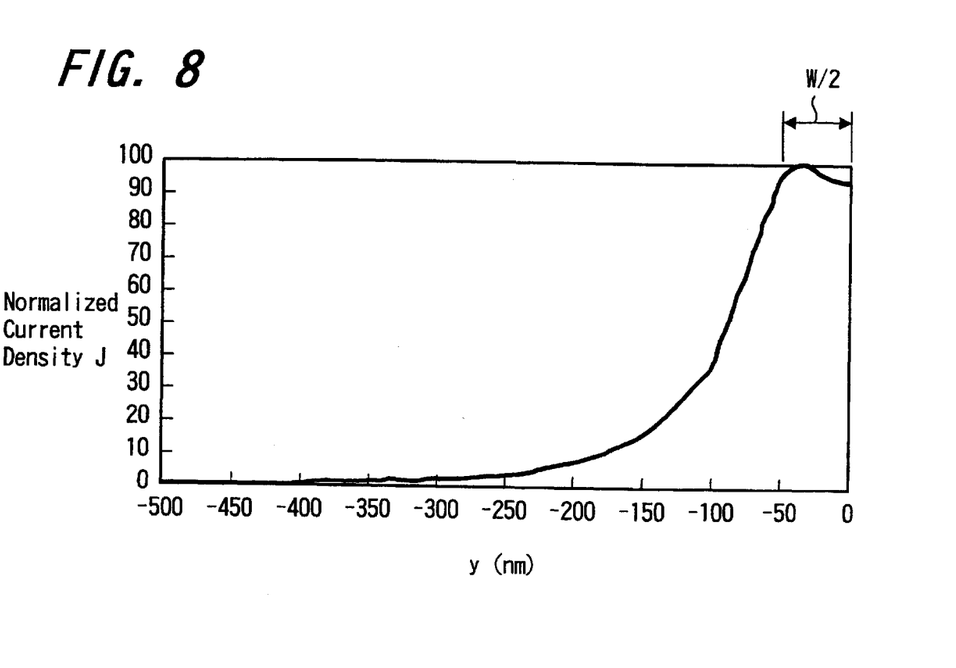
FIG. 8 is a graph showing distributions of a normalized current density in the width direction of the GMR element in the GMR element shown in FIG. 6.

FIG. 8 shows measured results obtained when the current density distributions within the GMR element 2 in the cross-sectional structure shown in FIG. 6 are calculated. The horizontal axis in FIG. 8 represents a distance y (nm) from the center of the GMR element 2, and the longitudinal axis in FIG. 8 represents a current density J normalized when a maximum value is assumed to be 100. The width of the opening portion at the insulating layer 4 on the upper electrode side is assumed to be 50 nm (=W/2) from the center of the GMR element 2.

A study of FIG. 8 reveals that, while a high current density is obtained at the inner side of the opening of the insulating layers 4, a current density progressively decreases toward the outer side of the opening of the insulating layers 4 in the opening portion.

Figure 9:
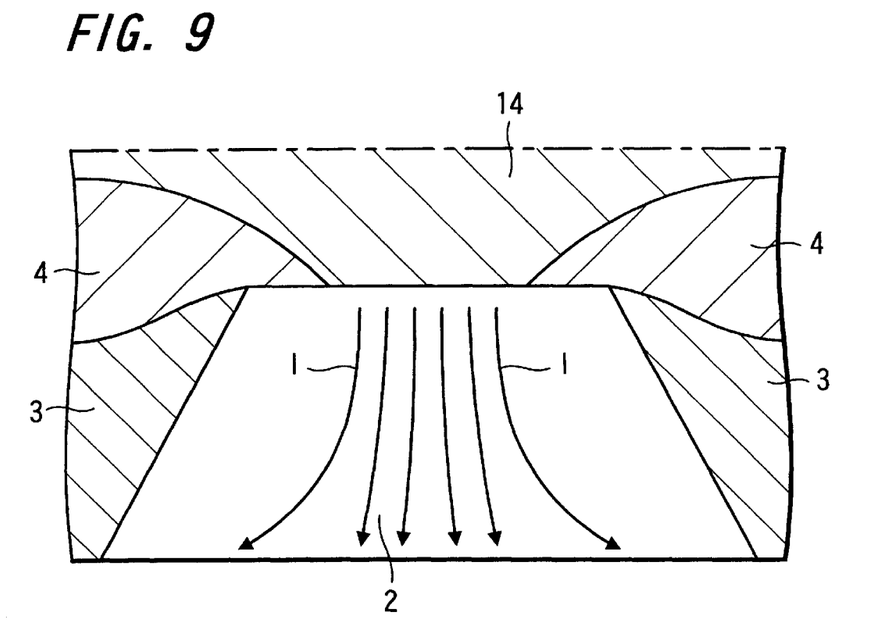
FIG. 9 is a cross-sectional view schematically showing the states of a current which flows through the GMR element shown in FIG. 6.

FIG. 9 schematically illustrates current distributions within the GMR element 2 shown in FIG. 6.

As shown in FIG. 9, a current I flows through the opening portion of the insulating layers 4 from the upper electrode to the GMR element 2. Although the current I spreads in the width direction (horizontal direction in FIG. 9) within the GMR element 2 and the hard magnetic films 3, the magnitude of the current I (current density) progressively decreases as it becomes distant from the insulating layers 4.

Specifically, as shown in FIG. 9, most of the current I passes the GMR element 2 while it is slightly spread from the opening portion of the insulating layers 4.

Moreover, at the very time, if the specific resistance of the hard magnetic films 3 is larger than that of the GMR element 2, then the spread of the current from the GMR element 2 to the hard magnetic films 3 can decrease remarkably.

From the above-mentioned descriptions, if the specific resistance of the heard magnetic films 3 is selected to be substantially the same as or larger than that of the GMR element 2, then even though the GMR element 2 and the conductive hard magnetic films 3 are directly brought in contact with each other, it can be considered that a leakage of the current I to the hard magnetic films 3 is sufficiently small.

As the material of the hard magnetic films 3, there can be used conductive hard magnetic material such as Co Cr Pt.

In particular, when the composition of Co Cr Pt is set to Co:Cr:Pt=78:10:12 (atomic ration %), the specific resistance of the hard magnetic films 3 can be made higher than magnetic films (hard films) 3 having satisfactory magnetic characteristics.

As described above, in the GMR element 2 having the cross-sectional structure shown in FIG. 6, since the hard magnetic films 3 are disposed in such a manner that the hard magnetic films 3 may be directly connected to the right and left of the GMR element 2, as compared with the case in which the insulating films are provided between the GMR element 2 and the hard magnetic films 3, the GMR element 2 can be stabilized more reliably by approaching the hard magnetic films 3 to the GMR element 2. As a consequence, a Barkhausen noise, a hysteresis noise and so forth can be decreased Having examined the simulation results shown in FIGS. 4 and 5, it is to be appreciated that a sufficiently strong stabilized magnetic field can be obtained when the spacing amount d=0 is satisfied.

Then, since the hard magnetic films 3 have a specific resistance which is substantially the same as or larger than that of the GMR element 2, the current I can be prevented from being leaked to the hard magnetic films 3 and can flow through the GMR element 2 intensively.

Further, since a current path between the upper gap film 14 serving as the upper electrode and the GMR element 2 is restricted by the opening defined between the insulating layers 4 of the respective sides, the current I can be deviated to the central portion of the GMR element 2 so that the current I can be prevented from being leaked to the hard magnetic films 3.

Accordingly, a sufficient current density can be maintained within the GMR element 2.

Since the insulating films need not be formed between the GMR element 2 and the hard magnetic films 3, the manufacturing process can be simplified by reducing the number of processes and an influence of dispersions occurring when the insulating films are deposited can be eliminated.

Further, since the hard magnetic films 3 are directly connected to the GMR element 2, heat can be diffused from the GMR element 2 to the hard magnetic films 3 and hence the GMR element 2 can be made highly reliable from the electromigration-proof standpoint and the like.

While the insulating films 4 are formed on the GMR element 2 as shown in FIG. 6, the present invention is not limited thereto, and the insulating layers may be disposed under the GMR element and the current path between the lower electrode and the GMR element may be restricted by the opening of the insulating layers. Also in this case, there can be achieved exactly the same effects.

While the insulating layers 4 are formed over (overlapping) the GMR element 2 as shown in FIG. 6, the positions of the insulting layers 4 are not limited to those shown in FIG. 6. For example, the end edges of the insulating layers may become coincident with the interface between the GMR element and the hard magnetic films or may further be located near the sides of the hard magnetic films from the interface.

The giant magneto-resistive effect element of the present invention can also be applied to the magneto-resistive effect type head (GMR head) including the giant magneto-resistive effect element, thin-film magnetic memory and thin-film magnetic sensor.

When the giant magneto-resistive effect element according to the present invention is applied to the magneto-resistive effect type head (GMR head) including the giant magneto-resistive effect element, similarly to the cross-sectional structure shown in FIG. 6, the magnetic shields are disposed so as to vertically sandwich the giant magneto-resistive effect element (GMR element) through the gap films made of non-magnetic conductive materials.

Then, when the magnetization direction of the free magnetization layer of the GMR element is changed by the signal magnetic field generated from the recording layer, e.g., the magnetic layer of the recording medium (magnetic recording medium) in response to record information, the resistance of the GMR element is changed. As a result, it becomes possible to output (reproduce) information recorded on the recording medium as a signal output.

With application of the giant magneto-resistive effect element of the present invention, since the hard magnetic films having the specific resistance larger than that of the giant magneto-resistive effect element are directly connected to the giant magneto-resistive effect element, the change of its resistance can be stabilized by stabilizing the giant magneto-resistive effect element so that the magneto-resistive effect type head which outputs the signal in response to the signal magnetic field from the recording medium can be operated stably.

Further, since the manufacturing cost of the giant magneto-resistive effect element and the yield in manufacturing the giant magneto-resistive effect element can be improved and head can be diffused into the hard magnetic films so that the giant magneto-resistive effect element can be made highly reliable from the electromigration-proof standpoint, the manufacturing cost of the magneto-resistive effect type head can be reduced, the yield in manufacturing the magneto-resistive effect type head can be improved and the magneto-resistive effect type head can be made highly reliable similarly.

Figure 10A:
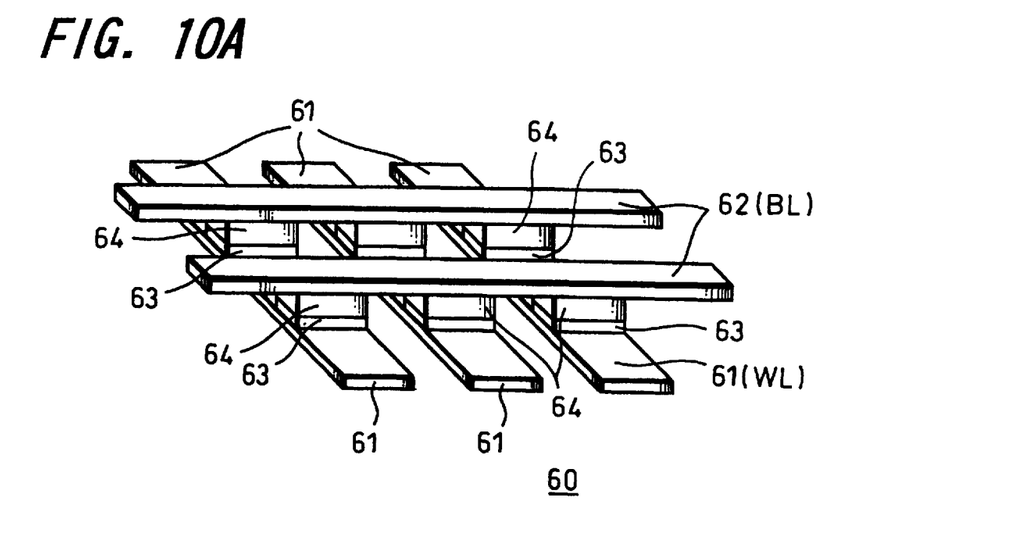
FIG. 10A is a perspective view showing a schematic arrangement of an element.
Figure 10B:
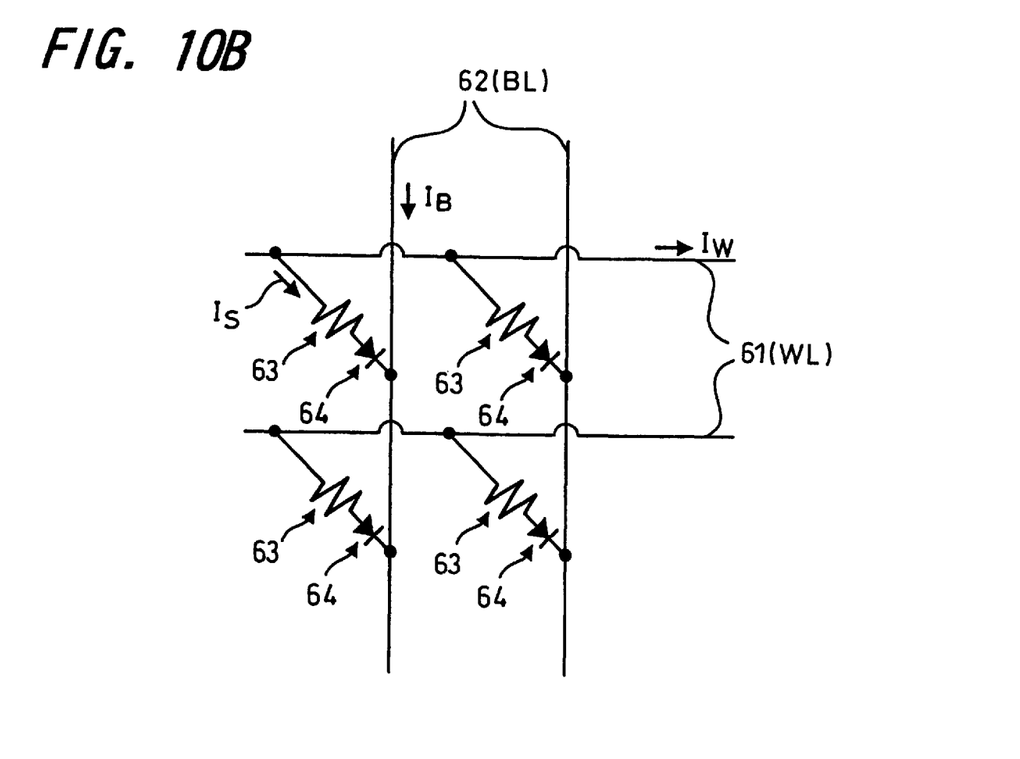
FIG. 10B is a schematic diagram shown in a circuit arrangement

FIGS. 10A and 10B show a thin-film magnetic memory according to an embodiment of the present invention to which the giant magneto-resistive effect element of the present invention is applied. FIG. 10A is a perspective view schematically showing an arrangement of an element, and FIG. 10B is a schematic diagram showing a circuit arrangement.

As illustrated, this thin-film magnetic memory 60 includes a memory cell disposed at an intersection between a word line (WL) 61 and a bit line (BL) 62, and is comprised of a large number of memory cells which are disposed in an XY matrix fashion.

The memory cell includes a CPP type GMR element 63 and a diode 64 formed of an amorphous silicon film. The CPP type GMR element 63 and the diode 64 are disposed in series, the CPP type GMR element 63 is connected to the word line 61 and the diode 64 is connected to the bit line 62. Under control of the diode 64, the current $I_S$ which flows through the CPP type GMR element 63 can flow from the word line 61 to the bit line 62.

As the CPP type GMR element 63, there is employed the aforementioned giant magneto-resistive effect element according to the present invention, i.e., the giant magneto-resistive effect element in which the metal film is formed on the giant magneto-resistive element.

With the above-mentioned arrangement, the magnetization direction of the magnetization free layer of the CPP type GMR element 63 can be inverted by a synthesized magnetic field of a current magnetic field based upon a current $I_W$ which flows through the word line 61 and a current magnetic field based upon a current $I_B$ which flows through the bit line 62, and hence this magnetization direction can be recorded as information of 1 or 0. On the other hand, when recorded information is read out, but effectively utilizing the GMR effect (giant magneto-resistive effect), the magnetization direction of the magnetization free layer, i.e., contents of information can be read out from the memory cell based upon the magnitude of the sense current $I_S$ which flows through the CPP type GMR element 63.

Although the current magnetic fields of both of the word line 61 and the bit line 62 are applied to the selected memory cell so that the magnetization direction of the magnetization free layer can be inverted, the current magnetic field of either the word line 61 or the bit line 62 is applied to a memory cell which is not selected with the result that the magnetization direction cannot be inverted. As a result, information can be recorded on only the selected memory cell.

With application of the giant magneto-resistive effect element of the present invention, since the hard magnetic films having the specific resistance larger than that of the CPP type GMR element 63 are directly connected to the CP type GMR element 63, the change of its resistance can be stabilized by stabilizing the CPP type GMR element 63. Consequently, operations for recording information on the memory cell and operations for reading cut information from the memory cell can be carried out stably.

The manufacturing cost of the CPP type GMR element 63 can be reduced and the yield in manufacturing the CPP type GMR element 63 can be improved. Moreover, since heat can be diffused into the hard magnetic films so that the CPP type GMR element 63 can be made highly reliable from the electromigration-proof standpoint, the manufacturing cost of the thin-film magnetic memory 60 can be reduced, the yield in manufacturing the thin-film magnetic memory 60 can be improved, and the thin-film magnetic memory 60 can be improved, and the thin-film magnetic memory 60 can be made highly reliable similarly.

When the giant magneto-resistive effect element according to the present invention is applied to the thin-film magnetic sensor, similarly to the cross-sectional structure shown in FIG. 6, the magnetic shields are disposed so as to vertically sandwich the giant magneto-resistive effect element (GMR element) through the gap film made of a non-magnetic conductive material.

While the magneto-resistive effect type head is able to sense the signal magnetic field corresponding to information recorded on the recording layer of the recording medium, the thin-film magnetic sensor is able to sense other general external magnetic fields.

Then, when the magnetic shields, for example, are shaped like magnetic shields suitable for sensing the external magnetic field, it is possible to sense the external magnetic field with a high efficiency.

With application of the giant magneto-resistive effect element according to the present invention, since the hard magnetic films having the specific resistance larger than that of the giant magneto-resistive effect element are directly connected to the giant magneto-resistive effect element, the change of its resistance can be stabilized by stabilizing the giant magneto-resistive effect element, and hence the thin-film magnetic sensor can be stably operated to output the signal in response to the external magnetic field.

The manufacturing cost of the giant magneto-resistive effect element can be reduced and the yield in manufacturing the giant magneto-resistive effect element can be improved. Further, since heat is diffused into the hard magnetic films, the giant magneto-resistive effect element can be made highly reliable from the electromigration-proof standpoint, the manufacturing cost of the thin-film magnetic sensor can be reduced, the yield in manufacturing the thin-film magnetic sensor can be improved, and the thin-film magnetic sensor can be made highly reliable similarly.

According to the above-mentioned present invention, since the hard magnetic films are directly connected to the laminated layer film of the giant magneto-resistive effect element, as compared with the case in which the insulating films are provided between the giant magneto-resistive effect element and the hard magnetic films, the giant magneto-resistive effect element can be stabilized more reliably by bringing the hard magnetic films close to the giant magneto-resistive effect element, and hence the change of the resistance of the giant magneto-resistive effect element can be stabilized. As a result, a Barkhausen noise, a hysteresis noise and so forth can be reduced in the giant magneto-resistive effect element.

Accordingly, the magneto-resistive effect type head, the thin-film magnetic memory and the thin-film magnetic sensor inducing the giant magneto-resistive effect element can be stably operated (write/read of a signal output and information) based upon the change of the resistance of the giant magneto-resistive effect element.

Further, according to the present invention, since the hard magnetic films have the specific resistance substantially the same as or larger than that of the giant magneto-resistive effect element, the current can be prevented from being leaked into the hard magnetic films and can flow through the giant magneto-resistive effect element intensively.

Furthermore, since the insulating layers are formed above or under the hard magnetic films, the current path between the giant magneto-resistive effect element and the upper electrode or the lower electrode can be restricted by the opening defined between the insulating layers of both sides. As a consequence, the current can be deviated to the central portion of the giant magneto-resistive effect element, and hence the current can be prevented from being leaked into the hard magnetic films.

Accordingly, a sufficient current density can be maintained within the giant magneto-resistive effect element.

Further, since the insulating films need not be formed between the giant magneto-resistive effect element and the hard magnetic films, the manufacturing process of the giant magneto-resistive effect element can be simplified by reducing the number of processes, and the influence of dispersions of films obtained when the insulating films are deposited can be eliminated.

Therefore, according to the present invention, the manufacturing cost of the giant magneto-resistive effect element can be reduced and the yield in manufacturing the giant magneto-resistive effect element can be improved.

Furthermore, according to the present invention, since heat is diffused from the giant magneto-resistive effect element to the hard magnetic films, from the electromigration-proof standpoint, the giant magneto-resistive effect element and the magneto-resistive effect type head, the thin-film magnetic memory and the thin-film magnetic sensor including the giant magneto-resistive effect element can be made highly reliable.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A current-perpendicular-to-plane-type giant magneto-resistive effect element comprising:

a laminated layer film having a trapezoidal cross-section, the laminated layer film not including an insulating layer;

an upper electrode disposed above said laminated layer film;

a lower electrode disposed below said laminated layer film;

first and second hard magnetic films directly connected to opposite sides in the width direction of said laminated layer film without an intervening insulating layer disposed between the first and second hard magnetic films and the laminated layer film;

first and second insulating layers formed above or under a same side of said respective first and second hard magnetic films; and an opening defined between said first and second insulating layers to restrict a current path between said upper electrode or said lower electrode and said laminated layer film, wherein said first and second hard magnetic films comprise Co:Cr:Pt having atomic ratio percentages of 78% Co, 10% Cr, and 12% Pt.

2. A magneto-resistive effect type head comprising:

a current-perpendicular-to-plane-type giant magneto-resistive effect element having:

a laminated layer film having a trapezoidal cross-section, the laminated layer film not including an insulating layer, an upper electrode disposed above said laminated layer film, a lower electrode disposed below said laminated layer film, first and second hard magnetic films directly connected to opposite sides in the width direction of said laminated layer film without an intervening insulating layer disposed between the first and second hard magnetic films and the laminated layer film, first and second insulating layers formed above or under a same side of said respective first and second hard magnetic films, and an opening defined between said first and second insulating layers to restrict a current path between said upper electrode or said lower electrode and said laminated layer film, wherein said first and second hard magnetic films comprise Co:Cr:Pt having atomic ratio percentages of 78% Co, 10% Cr, and 12% Pt;

upper and lower magnetic shields disposed so as to vertically sandwich said giant magneto-resistive effect element; and a gap film made of a non-magnetic conductive material disposed between one of the upper and lower magnetic shields and the giant magneto-resistive effect element, wherein said gap film and said upper and lower magnetic shields constitute said upper and lower electrodes, and wherein said laminated layer film and one of said upper and lower electrodes are electrically connected to each other through the opening defined between said first and second insulating layers.

3. A thin-film magnetic memory comprising:

a bit line;

a word line; and a current-perpendicular-to-plane-type giant magneto-resistive effect element comprising:

a laminated layer film having a trapezoidal cross-section, the laminated layer film not including an insulating layer, an upper electrode disposed above said laminated layer film, a lower electrode disposed below said laminated layer film, first and second hard magnetic films directly connected to opposite sides in the width direction of said laminated layer film without an intervening insulating layer disposed between the first and second hard magnetic films and the laminated layer film, first and second insulating layers formed above or under a same side of said respective first and second hard magnetic films, and an opening defined between said first and second insulating layers to restrict a current path between said upper electrode or said lower electrode and said laminated layer film, wherein said first and second hard magnetic films comprise Co:Cr:Pt having atomic ratio percentages of 78% Co, 10% Cr, and 12% Pt, wherein a memory cell having said giant magneto-resistive effect element is disposed corresponding to an intersection between said bit line and said word line.

4. A thin-film magnetic sensor comprising:

a current-perpendicular-to-plane-type giant magneto-resistive effect element having:

a laminated layer film having a trapezoidal cross-section, the laminated layer film not including an insulating layer, an upper electrode disposed above said laminated layer film, a lower electrode disposed below said laminated layer film, first and second hard magnetic films directly connected to opposite sides in the width direction of said laminated layer film without an intervening insulating layer disposed between the first and second hard magnetic films and the laminated layer film, first and second insulating layers formed above or under a same side of said respective first and second hard magnetic films, and an opening defined between said first and second insulating layers to restrict a current path between said upper electrode or said lower electrode and said laminated layer film, wherein said first and second hard magnetic films comprise Co:Cr:Pt having atomic ratio percentages of 78% Co, 10% Cr, and 12% Pt;

upper and lower magnetic shields disposed so as to vertically sandwich said giant magneto-resistive effect element; and a gap film made of a non-magnetic conductive material disposed between one of the upper and lower magnetic shields and the giant magneto-resistive effect element, wherein said gap film and said upper and lower magnetic shields constitute said upper and lower electrodes, and wherein said laminated layer film and one of said upper and lower electrodes are electrically connected to each other through the opening defined between said first and second insulating layers.

* * * * *